(12) United States Patent
Harada et al.

(10) Patent No.: US 7,445,434 B2
(45) Date of Patent: Nov. 4, 2008

(54) COATING MATERIAL FOR THERMAL BARRIER COATING HAVING EXCELLENT CORROSION RESISTANCE AND HEAT RESISTANCE AND METHOD OF PRODUCING THE SAME

(75) Inventors: Yoshio Harada, Hyogo (JP); Tatsuo Suidzu, Hyogo (JP); Yakema Teratani, Hyogo (JP)

(73) Assignee: Tocalo Co., Ltd., Hyogo (JP)

( * ) Notice: Subject to any disclaimer, the term of this patent is extended or adjusted under 35 U.S.C. 154(b) by 605 days.

(21) Appl. No.: 10/795,998

(22) Filed: Mar. 10, 2004

(65) Prior Publication Data

US 2008/0166548 A1    Jul. 10, 2008

(30) Foreign Application Priority Data

Mar. 24, 2003    (JP)    ............................. 2003-079930

(51) Int. Cl.
*F04D 29/34*    (2006.01)
*B64C 11/16*    (2006.01)
*B63H 7/02*    (2006.01)
*C03C 29/00*    (2006.01)

(52) U.S. Cl. ............................. 416/241 R; 416/241 B; 428/632

(58) Field of Classification Search ............. 416/241 R, 416/241 B; 428/632
See application file for complete search history.

(56) References Cited

U.S. PATENT DOCUMENTS

| | | | |
|---|---|---|---|
| 4,714,624 A * | 12/1987 | Naik ........................... 148/527 |
| 5,082,741 A | 1/1992 | Taira et al. |
| 5,273,712 A * | 12/1993 | Czech et al. ................... 420/40 |
| 5,514,482 A * | 5/1996 | Strangman ................... 428/623 |
| 5,912,087 A * | 6/1999 | Jackson et al. .............. 428/610 |
| 5,985,467 A * | 11/1999 | Beele .......................... 428/623 |
| 6,082,444 A | 7/2000 | Harada et al. |
| 6,132,890 A | 10/2000 | Harada et al. |
| 6,180,259 B1 | 1/2001 | Harada et al. |
| 6,387,526 B1 * | 5/2002 | Beele .......................... 428/469 |
| 2005/0112398 A1 * | 5/2005 | Darolia et al. .............. 428/632 |

FOREIGN PATENT DOCUMENTS

| | | |
|---|---|---|
| JP | 58-16094 | 1/1983 |
| JP | 59-118847 | 7/1984 |
| JP | 60-141842 | 7/1985 |
| JP | 62-211286 | 9/1987 |
| JP | 62-211386 | 9/1987 |
| JP | 62-211387 | 9/1987 |
| JP | 64-087050 | 3/1989 |

(Continued)

OTHER PUBLICATIONS

English Language Abstract of JP 2001-164381.

(Continued)

*Primary Examiner*—Rena Dye
*Assistant Examiner*—Gordon R. Baldwin
(74) *Attorney, Agent, or Firm*—Greenblum & Bernstein, P.L.C.

(57) ABSTRACT

A coating material for a thermal barrier coating having excellent corrosion resistance and heat resistance comprises a substrate, an undercoat made of an aluminum-containing heat-resistant alloy, $Cr_2O_3$ layer as a middle layer on the undercoat, and a top coat made of $ZrO_2$ based ceramic on the middle coat.

11 Claims, 1 Drawing Sheet

FOREIGN PATENT DOCUMENTS

| | | |
|---|---|---|
| JP | 3-87379 | 4/1991 |
| JP | 4-36454 | 2/1992 |
| JP | 4-260622 | 9/1992 |
| JP | 2000-301655 | 10/2000 |
| JP | 2001-164381 | 6/2001 |

OTHER PUBLICATIONS

English Language Abstract of JP 62-211286.
English Language Abstract of JP 62-211386.
English translation of "Spraying Technique Handbook," May 30, 1998, p. 505. 1.
English Language Abstract of JP 59-118847.
English Language Abstract of JP of JP 64-087050.
English Language Abstract of JP 4-260622.
English Language Abstract of JP62-211387.
English Language Abstract of JP 4-36454.
English Language Abstract of JP 3-87379.
English Language Abstract of JP 2000-301655.
English Language Abstract of JP 59-118847, Jul. 1984.
English Language Abstract of JP of JP 64-087050, Mar. 1989.
English Language Abstract of JP 4-260622, Sep. 1992.
English Language Abstract of JP62-211387, Sep. 1997.
English Language Abstract of JP 4-36454, Feb. 1992.
English Language Abstract of JP 3-87379, Apr. 1991.
English Language Abstract of JP 2000-301655, Oct. 2000.
English Language Abstract of JP 2001-164381, Jun. 2001.
English Language Abstract of JP 62-211386, Sep. 1987.

* cited by examiner

Heating →

US 7,445,434 B2

COATING MATERIAL FOR THERMAL BARRIER COATING HAVING EXCELLENT CORROSION RESISTANCE AND HEAT RESISTANCE AND METHOD OF PRODUCING THE SAME

BACKGROUND OF THE INVENTION

1. Field of the Invention

This invention relates to a coating material for a thermal barrier coating suitable as a starting material for parts of a high temperature exposing apparatus such as a gas turbine, a jet engine or the like as well as a method of producing the same.

2. Background Art

As is well-known, energetic search and development are progressing for the purpose of improving heat efficiency in driving machines such as diesel engine, boiler, gas turbine engine, jet engine and the like. However, the improvement of the heat efficiency results in the strong increase of severe heat loading to the constitutional member. As a metal material used in the high temperature portion of the driving machine, therefore, it is required to have a high mechanical strength under a service environment and excellent resistance to high-temperature oxidation and resistance to high-temperature corrosion.

In order to satisfy such requirements, there are developed many heat-resistant alloys or so-called superalloys consisting essentially of non-ferrous metal elements such as Cr, Ni, Co, W, Ta, Al, Ti or the like.

In these superalloys, however, the high-temperature strength is most preferential, so that it tends to necessarily suppress the addition of the metal element not acting to the improvement of the strength to a low ratio. As a typical example of the metal element not acting to the improvement of the strength are mentioned Cr, Al, Si and the like. On the other hands, these elements are excellent in the oxidation resistance and the resistance to high-temperature corrosion, so that it is common that the oxidation resistance and the resistance to high-temperature corrosion are poor in the superalloy prevailing the high-temperature strength as mentioned above.

In view of the above situation, the lowering of the resistance force to the chemical damage of the superalloy used in the high-temperature environment is compensated by previously coating the surface of the superalloy with a metal of Cr, Al, Si or the like or an alloy thereof through a spraying method or a diffusion penetration method.

Recently, a spraying method of easily forming a coating of an oxide or an alloy having an oxidation resistance and a heat resistance is popularized, and the superiority of the spraying method is further enhanced by the development of spraying material shown as MCrAlX alloy (wherein M is at least one metal selected from Ni, Co and Fe, and X is at least one metal selected from Y, Hf, Ta, Cs, Pt, Ce, Zr, La, Si and Th) developing an excellent oxidation resistance. As a technique relating to the MCrAlX alloy material, there are techniques disclosed in JP-A-59-118847 and JP-A-60-141842.

As a field using the spray coating of the MCrAlX alloy, there is a thermal barrier coating used by working into a high-temperature exposing material (NASA Technical Memorandum: NASA-TM-X3425: hereinafter abbreviated as "TBC" simply). This coating is constructed by forming a coating of MCrAlX alloy as an undercoat and laminating a coating of $ZrO_2$ based ceramic having an excellent heat resistance and a small thermal conductivity as a top coat thereon.

The TBC comprising a combination of MCrAlX alloy coating and the $ZrO_2$ based ceramic coating is utilized as not only a high-temperature exposing material for a gas turbine but also a heat-resistant coating for a centrifugal casting mold (see JP-A-64-87050) or for a transferring roll of molten plate glass (see JP-A-4-260622).

Even in the TBC combining the MCrAlX alloy and the $ZrO_2$ based ceramic, however, there is a problem that only the top coat is frequently peeled off from the interface between both the coatings under a severer environment represented by a recently high-temperature operating environment of the gas turbine to lose the thermal barrier action.

As a countermeasure, there have hitherto been proposed a technique wherein the peeling of the top coat is prevented by forming $Al_2O_3$ layer obtained through the oxidation of Al coating layer on the MCrAlX alloy coating as an undercoat to improve the oxidation resistance (e.g. JP-A-62-211387), a method of preventing the peeling of the top coat by adding CaO, $SiO_2$ to $ZrO_2$ of the top coat to generate fine cracks to thereby disperse heat stress (e.g. JP-A-4-36454), a method wherein $ZrO_2$ based ceramic coating formed by the spraying method as a top coat is fused by laser heating and longitudinal cracks are generated in the top coat by utilizing stress in the solidification course to mitigate thermal stress to thereby prevent the peeling of the top coat (e.g. JP-A-58-16094), a method wherein the formation of $ZrO_2$ based ceramic as a top coat is carried out by vapor deposition method using an electron beam heat source and microcrystal of $ZrO_2$ based ceramic is grown into column to mitigate thermal stress (e.g. JP-A-3-87379) and the like.

However, these techniques have attained their objects at a use temperature region (1100-1300° C.) of the gas turbine in the time of filing them, but are insufficient under such a use environment that the recent operating temperature exceeds 1500° C.

Also, the coating generating fine cracks in the top coat or growing $ZrO_2$ based ceramic particles grown into the column indicates the effect of mitigating thermal stress, but comes a problem that corrosive components in the combustion gas (e.g. oxygen, steam, $SO_x$, $NO_x$, NaCl, $V_2O_5$, $Na_2SO_4$ and the like) penetrate into the inside through the fine crack portion or the columnar crystal to corrode the heat-resistant alloy as an undercoat to thereby lower the joining force of the interface between the top coat and the undercoat.

SUMMARY OF THE INVENTION

The invention is to solve not only a technical problem that as to the thermal barrier coating (TBC) used in the high-temperature combustion gas, the top coat of $ZrO_2$ based ceramic is prematurely broken or locally peeled off by the occurrence of thermal stress to lose thermal barrier function but also a problem that the undercoat of the heat-resistant alloy is selectively corroded by the corrosive gases in the TBC particularly used under severer corrosive environment to lower the bonding force to the top coat to thereby peel off the top coat. The followings are described concretely.

(i) The TBC is usually constructed with an undercoat of MCrAlX alloy and a top coat of $ZrO_2$ based ceramic, in which the top coat mainly acts to prevent the temperature rise of the substrate through radiant heat. However, when the top coat is subjected to a violent temperature change, only the top coat is frequently peeled off from the interface to the undercoat and hence the function as TBC is lost.

(ii) The TBC subjected to the violent temperature change has a metallic undercoat and a ceramic top coat. The difference in the thermal properties inherent to these substances (thermal stress) is concentrates in the interface between both the coatings in an extremely form to cause the peeling from the interface of the coatings.

(iii) The top coat formed by the existing technique lowers the thermal stress, which is generated by the mechanism as mentioned in the above item (ii), and the thermal conductivity through radiant, so that it is optimum to be a porous state (for example, Spraying Technology Handbook, edited by Japan Thermal Spraying Society, published by New Technology Development Center, May 30, 1998, page 505). Under an environment that the gas turbine is recently operated at a higher temperature, the porous top coat generates many lateral cracks (cracks in a horizontal direction parallel to the undercoat face), and the generation and growth of the lateral (horizontal) cracks become violent in not only the interface to the undercoat but also the top coat, so that there is a problem that the function as the top coat considerably lowers.

(iv) The porous top coat according to the existing technique shows relatively good TBC properties at an operating temperature of the existing gas turbine. However, as the temperature region becomes further higher level, the shrinkage phenomenon through sintering becomes remarkable and the shrinkage stress is generated and hence many cracks occur even in the lateral direction of the top coat and grow to cause the peeling of the top coat.

(v) The technique of mitigating the occurrence of thermal stress by causing fine longitudinal cracks in the top coat, or by forming longitudinal cracks in the top coat through laser irradiation, or by forming the top coat film through electron beam deposition to grow ultra-fine particles of $ZrO_2$ ceramic into column or the like for solving the problems of the above items (i) to (iv) develops the effect as a countermeasure for peeling the top coat through physical action. However, the structure of such a top coat facilitates the penetration of atmosphere gas component into the inside, and hence the corroding rate of the undercoat becomes faster and it strongly tends to rather promote chemical damage of the TBC.

(vi) The corrosion of the undercoat in the TBC through an atmosphere gas component occurs even in any top coat coating member irrespectively of the presence or absence of the longitudinal crack in the top coat. Therefore, the peeling of the top coat resulted from the corrosion of the surface of the undercoat when the TBC is used as not only a member for the gas turbine but also a high-temperature member for a petroleum decomposition gas or a chemical plant or further in an atmosphere containing a great amount of a corrosive gas can not be prevented by the existing technique.

It is, therefore, an object of the invention to provide a coating material for a thermal barrier coating developing its function over a long time of period without causing the peeling of the top coat produced by physical (thermal stress) and chemical (corrosion) actions on not only TBC used as a part for a gas turbine under the conventional operating environment and a temperature environment further raised to 1500° C. but also TBC used under a very sever condition of corrosive environment.

It is another object of the invention to provide a method for surely forming the coating material for thermal barrier coating.

The invention solves the technical problems inherent to the existing techniques by the following means.

(1) A coating material for a thermal barrier coating having excellent corrosion-resistance and heat resistance comprising a substrate, an undercoat made of an aluminum-containing heat-resistant alloy, $Cr_2O_3$ layer of 0.2-10 μm as a middle layer, and a top coat made of $ZrO_2$ based ceramic.

(2) A coating material for a thermal barrier coating having excellent corrosion resistance and heat resistance comprising a substrate, an undercoat made of an aluminum-containing heat-resistant alloy, $Al_2O_3$ layer produced on the surface of the undercoat by preferentially oxidizing Al in the components of the undercoat in the presence of $Cr_2O_3$ layer and $Cr_2O_3$ layer of 0.2-10 μm formed thereon as a middle layer, and a top coat made of $ZrO_2$ based ceramic.

(3) It is preferable that $Cr_2O_3$ layer as a middle layer is a chemical densified film obtained by applying an aqueous solution of one or more selected from chromic anhydride, ammonium chromate and ammonium bichromate and firing it.

In the invention, it is preferable that

① the thickness of $Al_2O_3$ layer is 1-30 μm;

② the undercoat is a heat-resistant alloy having an Al content of 3-24 mass % and represented by the following chemical formula:

wherein M: one or more selected from Co, Ni and Fe,

X: one or more selected from Y, Hf, Ta, Cs, Ce, La, Th, W, Si, Pt, Mn and B;

③ the undercoat is one formed by a spraying process or an electron beam deposition process at a thickness of 30-500 μm;

④ the top coat is a $ZrO_2$ based ceramic coating containing 5-40 mass % of at least one oxide selected from $Y_2O_3$, CaO, $CeO_2$, MgO, $SiO_2$, $Yb_2O_3$ and $Sc_2O_3$ and formed by a spraying process or an electron beam deposition process at a thickness of 50-600 μm.

(4) The coating material for thermal barrier coating according to the invention is produced by using the following method. That is, the invention lies in a method of producing a coating material for thermal barrier coating having excellent corrosion resistance and heat resistance, comprising forming an undercoat made of a heat-resistant alloy having an Al content of 3-24 mass % on a surface of a substrate through spraying process or an electron beam deposition process, forming a middle layer of $Cr_2O_3$ layer having a thickness of 0.2-10 μm on a surface of the undercoat by repeating a procedure of applying an aqueous mixed solution of one or more of chromic anhydride, ammonium chromate and ammonium bichromate and firing under heating at 500-900 K for 1-5 hours one time or plural times, and forming a top coat of $ZrO_2$ based ceramic on the middle layer through a spraying process or an electron beam deposition process.

(5) Also, the invention lies in a method of producing a coating material for thermal barrier coating having excellent corrosion resistance and heat resistance, comprising forming an undercoat made of a heat-resistant alloy having an Al content of 3-24 mass % on a surface of a substrate through spraying process or an electron beam deposition process, forming a middle layer of $Cr_2O_3$ layer having a thickness of 0.2-10 μm on a surface of the undercoat by repeating a procedure of applying an aqueous mixed solution of one or more of chromic anhydride, ammonium chromate and ammonium bichromate and firing under heating at 500-900 K for 1-5 hours one time or plural times, heating in an atmosphere or under vacuum or in an inert gas atmosphere at 1200-1500 K for 1-20 hours to form an $Al_2O_3$ layer produced through preferential oxidation reaction of Al contained in the undercoat on the surface of the undercoat just beneath $Cr_2O_3$ layer as a part of the middle layer, and forming a top coat of $ZrO_2$ based ceramic on the middle layer.

BRIEF DESCRIPTION OF THE DRAWINGS

The invention will be described with reference to the accompanying drawings, wherein.

DETAILED DESCRIPTION OF THE INVENTION

Figure 1A:
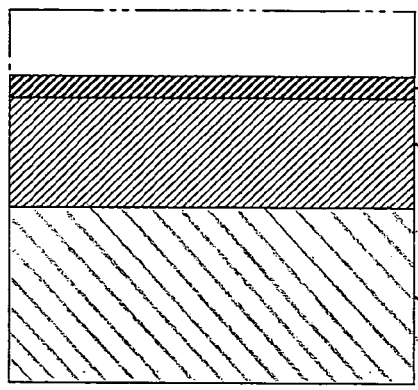
FIG. 1a and FIG. 1b are a schematic view illustrating a step of preferentially forming an $Al_2O_3$ layer on a surface of an Al-containing alloy coating by the method of the invention.

At first, the experiment succeeding the invention and the results thereof are described.

In this experiment is examined a case that Al contained in the undercoat is preferentially oxidized by the oxidation-reduction reaction with the $CrO_2$ film formed as the middle layer to form $Al_2O_3$ layer on a surface layer portion of the undercoat. That is, this experiment conducts the examination on influences of the Al content in MCrAlX alloy sprayed coating used as an undercoat, the heating atmosphere and the presence or absence of $Cr_2O_3$ layer as a middle layer upon the formation of $Al_2O_3$ layer when the undercoat is formed on the substrate by spraying MCrAlX alloy having a different Al content and then the undercoat is heated at a high temperature.

A coating of a high temperature-resistant, oxidative alloy having a thickness of 300 μm is formed by using a MCrAlX spraying material shown in Table 1 and applying onto a surface of a substrate of Ni-based superalloy test piece (diameter 13 mm×length 60 mm) through a plasma spraying process under a reduced pressure. Moreover, the composition of the Ni-based superalloy substrate is also shown in Table 1.

TABLE 1

| Kind | Chemical component (mass %) | | | | | | | | |
| --- | --- | --- | --- | --- | --- | --- | --- | --- | --- |
| | Co | Ni | Cr | Al | Y | Ti | Mo | W | Ta |
| Spraying material | balance | 32.1 | 21.2 | 1-30 | 0.39 | — | — | — | — |
| Ni-based superalloy | 8.11 | balance | 15.8 | 3.45 | — | 3.60 | 1.78 | 2.46 | 1.92 |

Then, the operation in which the test piece is immersed in an aqueous solution of 30 mass % $CrO_3$ and thereafter dried at 750 K for 20 minutes is repeated 5 times to form $Cr_2O_3$ layer (middle layer) on the sprayed coating of the high temperature-resistant, oxidative alloy (undercoat).

The test piece formed with the $Cr_2O_3$ layer is further heated in air and in an Ar gas atmosphere at 1400K for 9 hours and cut to observe the presence or absence of the formation of $Al_2O_3$ coating and the state thereof by means of an optical microscope. Moreover, there is used a test piece conducting no immersion into the aqueous solution of 30 mass % $CrO_3$ (no formation of $Cr_2O_3$ layer) as a comparative example. The test results are shown in Table 2.

TABLE 2

| No. | Al content in MCrAlX alloy coating (mass %) | Presence or absence of formation of $Cr_2O_3$ layer | Formation of $Al_2O_3$ layer by heating*1 | | Remarks*2 |
| --- | --- | --- | --- | --- | --- |
| | | | in air | in Ar atmosphere | |
| 1 | 1 | presence | X | X | B |
| 2 | | absence | X | X | B |
| 3 | 2 | presence | X | Δ | B |
| 4 | | absence | X | X | B |
| 5 | 3 | presence | ○ | ○ | A |
| 6 | | absence | Δ | X | B |
| 7 | 8 | presence | ○ | ○ | A |
| 8 | | absence | ○ | X | B |
| 9 | 12 | presence | ○ | ○ | A |
| 10 | | absence | ○ | X | B |
| 11 | 20 | presence | ○ | ○ | A |
| 12 | | absence | ○ | X | B |
| 13 | 24 | presence | ○ | ○ | A |
| 14 | | absence | ○ | X | B |
| 15 | 30 | presence | ○ | ○ | A |
| 16 | | absence | ○ | X | B |

*1X: not observed the formation of continuous $Al_2O_3$ layer Δ: partly observed formation defect of $Al_2O_3$ layer ○: observed the formation of continuous $Al_2O_3$ layer
*2A: acceptable example B: comparative example As seen from the experimental results of Table 2, the following is found on the Al content in the undercoat formed on the alloy substrate. That is, when the heating treatment (1400 K×9 hours) is conducted in air, if the Al content in the MCrAlX alloy coating of the undercoat is less than 3 mass % (Nos. 1-4), the formation of dense $Al_2O_3$ layer is not observed irrespectively of the presence or absence of the formation of the $Cr_2O_3$ layer. On the other hand, in the coatings having the Al content of not less than 3 mass % (Nos. 5-16), the $Al_2O_3$ layer is formed even in the absence of the $Cr_2O_3$ layer, but the oxides such as CoO, NiO and the like are co-existent, and also the formation of the $Al_2O_3$ layer is discontinuous and places causing no formation is sometimes observed and it is unstable.

Further, when the heating treatment is conducted under a condition that an oxygen partial pressure is very small as in the Ar gas atmosphere, in the case having no $Cr_2O_3$ layer on the undercoat (Nos. 2, 4, 6, 8, 10, 12, 14, 16), even if a great amount of Al is contained in the undercoat, the formation of $Al_2O_3$ layer is not observed. On the contrary, in the coating having the $Cr_2O_3$ layer (Nos. 5, 7, 9, 11, 13, 15, 17) except for the case that the Al content in the undercoat is less (Nos. 1 and 3), the dense $Al_2O_3$ layer is always formed likewise the heating in air.

From this fact, it is understood that when heating the Al-containing undercoat having the $Cr_2O_3$ layer thereon, Al component in the undercoat causes oxidation-reduction reaction with the $Cr_2O_3$ layer to selectively oxidize Al (preferential oxidation), whereby a thin coating of $Al_2O_3$ is formed and at least a part of $Cr_2O_3$ is vaporized.

Then, the method of forming the thermal barrier coating (TBC) comprised of the undercoat, middle layer ($Al_2O_3$, $Cr_2O_3$) and top coat on the substrate is described with respect to the steps.

(A) Formation of Undercoat and its High-temperature Oxidation Properties

The first stage of TBC formation through spraying process is a step of forming an undercoat on a substrate of a heat-resistant metal such as heat-resistant steel, Ni-based alloy, Co-based alloy or the like. Here, MCrAlX alloy is adopted as a typical alloy for the undercoat and the high-temperature oxidation properties of a sprayed coating thereof is described.

In general, when the sprayed coating of MCrAlX alloy is heated, the metals constituting the alloy produce the respective oxides, which are existent on the surface of the coating in a form of film. Among the metals constituting the MCrAlX alloy, when M is Co, Ni and X is Y, an oxygen equilibrium dissociation pressure (atm) of the oxide at 1273 K is shown in Table 3.

TABLE 3

| Oxidation reaction | Equilibrium dissociation pressure (atm) |
|---|---|
| $Co + \frac{1}{2}O_2 \leftrightarrow CoO$ | $1.6 \times 10^{-12}$ |
| $2Cr + \frac{3}{2}O_2 \leftrightarrow Cr_2O_3$ | $2.5 \times 10^{-22}$ |
| $Ni + \frac{1}{2}O_2 \leftrightarrow NiO$ | $1.7 \times 10^{-10}$ |
| $2Al + \frac{3}{2}O_2 \leftrightarrow Al_2O_3$ | $1.3 \times 10^{-35}$ |
| $2Y + \frac{3}{2}O_2 \leftrightarrow Y_2O_3$ | $1.0 \times 10^{-41}$ |

As shown in Table 3, the equilibrium dissociation pressure of oxygen required in the oxidation of Y among the metals constituting the MCrAlX alloy is smallest, and the oxide ($Y_2O_3$) is formed at an oxygen partial pressure of $1.1 \times 10^{-41}$ atm in an equilibrium theory. However, the Y content contained in the MCrALX alloy is generally as very small as not more than 1 mass %, so that even if all Y contained in the alloy is produced as an oxide, the whole surface of the sprayed coating can not be covered with such an oxide. Also, the purpose for adding Y is to improve the adhesion property of $Al_2O_3$ as a protective oxide coating, and hence $Y_2O_3$ itself does not develop the resistance to high-temperature oxidation under a high-temperature environment.

In the other components constituting the alloy, the equilibrium dissociation pressure of oxygen required in the oxidation is Al: $1.3 \times 10^{-35}$ atm, Cr: $2.5 \times 10^{-22}$ atm, Co: $1.6 \times 10^{-12}$ atm and Ni: $1.7 \times 10^{-10}$ atm, respectively, so that all alloying elements are placed under a condition capable of producing the oxide under an environment having a high oxygen partial pressure such as air or the like. For this end, a composite oxide comprised of not only $Al_2O_3$ but also CoO, NiO and $Cr_2O_3$ is produced on the surface of the MCrAlX alloy sprayed coating. The composite oxide is large in the oxidation rate under the same temperature condition as compared with $Al_2O_3$ and has a large volume as an oxide. In the general TBC, the formation and growth of the above composite oxide occurs at the interface between the undercoat and the top coat, so that the bonding strength between both the coats considerably lowers, which results in the peeling of the top coat.

In the invention, therefore, it is attempted to improve the bonding strength of the top coat to the undercoat by forming the middle layer of $Cr_2O_3$ layer described in the following (B) item as seen from the above experiment. This point is a most characteristic construction of the invention.

Moreover, as the method of forming the undercoat with the MCrAlX alloy, there may be utilized any one of a plasma spraying process under a reduced pressure, a high-velocity-oxyfuel flame spraying process, an atmospheric plasma process, an explosion spraying process and so on. Naturally, a PVD process using an electron beam heat source (EB-PVD) may be preferably utilized, so that the formation method of MCrAlX alloy coating as a high temperature-resistant oxidative alloy coating is not particularly limited.

Also, the thickness of the undercoat is preferable to be within a range of 30-500 μm. When the thickness is less than 30 μm, the protection life on the substrate is short under a use environment condition at a high temperature, while when it exceeds 500 μm, the considerable improvement of performances as the undercoat is not observed.

On the other hand, as the MCrAlX alloy of the undercoat used in the invention may be used any commercially available MCrAlX alloys, but it is required to at least contain 3-24 mass % of Al and two or more metal components selected from Cr, Ni, Co and Y. The necessity and importance of Al content are clear from the above experiment, and also as is explained at the following step (B), when the Al content is less than 3 mass %, $Al_2O_3$ layer is formed on the surface of the undercoat, but the layer thickness is thin and the denseness is lacking and the sufficient protection property can not be developed. While when the Al content exceeds 24 mass %, the dense $Al_2O_3$ layer having an excellent resistance to high-temperature oxidation can be formed, but the MCrAlX alloy coating itself is brittle and produces cracks through slight shock or partly falls off and hence it is difficult to put into practical use.

(B) Formation of Middle Layer of $Cr_2O_3$ Layer on the Surface of the Undercoat and High-temperature Properties Thereof In the invention, it is considered that dense $Al_2O_3$ layer being rich in the adhesion property and excellent in the protection property is positively formed on the surface of the MCrAlX alloy coating by the treatment as mentioned below in view of the high temperature properties of the undercoat comprised of the above MCrAlX alloy coating. The method is concretely explained below.

(1) At first, a chromium-containing aqueous solution such as Chromic acid ($CrO_3$), ammonium chromate {$(NH_4)_2CrO_4$}, ammonium bichromate {$(NH_4)_2Cr_2O_7$} and the like is applied alone or in a combination of two or more onto the surface of the undercoat comprised of the MCrAlX alloy coating laminated on the surface of the substrate to form $Cr_xO_3$ layer in a surface layer and: on a surface of the MCrAlX alloy coating. Moreover, in the invention, the above aqueous solution may be adhered onto or impregnated into the surface of the MCrAlX alloy coating by spraying or immersing.

(2) Then, the MCRAlX alloy coating after the treatment of the item (1) is heated in an electric furnace at 500-800 K for 10-60 minutes to form a crystalline or amorphous chromium oxide ($Cr_2O_3$) on the surface of the alloy coating (undercoat) through a chemical densification treatment. This is based on the utilization of a reaction in which the chromium-containing aqueous solutions of chromic acid, ammonium chromate and ammonium bichromate are decomposed by heating at 500-800 K to finally produce $Cr_2O_3$ according to the following reaction formulae:

$$CrO_3 \rightarrow 1/2 Cr_2O_3 + 3/4 O_2$$

$$(NH_4)_2CrO_4 \rightarrow 1/2 Cr_2O_3 + 2NH_3 + H_2O + 3/4 O_2$$

$$(NH_4)_2Cr_2O_7 \rightarrow Cr_2O_3 + 2NH_3 + H_2O + 3/2 O_2$$

Moreover, this treatment uses the aqueous solution, so that it is possible to produce $Cr_2O_3$ in micro-recess portions and pores of the MCrAlX alloy coating.

(3) If necessary, the operations of the above items (1) and (2) are repeated several times to increase the thickness of $Cr_2O_3$ formed on the surface of the alloy coating. Moreover, the thickness of $Cr_2O_3$ is preferable to be 0.2-10 μm. When the $Cr_2O_3$ thickness is less than 0.2 μm, the effect is not sufficiently obtained, while when it exceeds 10 μm, the time required for the treatment is long, which is disadvantageous in economical reasons. Moreover, metallic Cr is produced in addition to the $Cr_2O_3$ layer in accordance with the heating atmosphere in the treatments of the items (1)-(3), which is explained later.

When the $Cr_2O_3$ layer is a middle layer and a top coat as mentioned later is formed thereon (i.e., when the product of the invention is used in turbine parts, since it is exposed to a high-temperature heating in use, the treatment of step (4) is not always necessary), the following step (4) is useless. In this case, the $Cr_2O_3$ thickness is 0.2-10 μm. The reason thereof will be later.

(4) The MCrAlX alloy coating after the treatment of the item (3) is heated under an environment of atmosphere, vacuum, inert gas, combustion gas of a fossil fuel, steam or the like at 950-1500 K for 1-30 hours. By this heating treatment, $Cr_2O_3$ produced in the treatment of the item (3) and Al contained in the components of the undercoat are selectively subjected to oxidation-reduction reaction on the surface of the MCrAlX alloy coating (undercoat) and hence the layer comprised of only $Al_2O_3$ is formed on the surface of the MCrAlX alloy coating just beneath the $Cr_2O_3$ layer according to the following reaction formula and forms the middle layer together with the remaining $Cr_2O_3$.

$$Cr_2O_3 + 2Al \rightarrow Al_2O_3 + 2Cr$$

The above reaction utilizes the difference of chemical affinity with oxygen between Cr and Al (equilibrium dissociation pressure). Al having a chemical affinity with oxygen larger than that of Cr (equilibrium dissociation pressure is small) deprives oxygen from $Cr_2O_3$ (selective oxidation) to form $Al_2O_3$ layer. Also, Co, Ni and the like are contained in the MCrAlX alloy in addition to Al, but these elements are smaller in the chemical affinity with oxygen than that of Cr (equilibrium dissociation pressure is large) and can not deprive oxygen from $Cr_2O_3$. As a result, the oxide layer comprised of only $Al_2O_3$ is formed.

In the invention, the $Al_2O_3$ layer is produced by the above reaction, but may be formed by a series of the treatments of the items (2) and (3), for example by heating at 500-1500 K for 1-30 hours.

In case of forming the coating of $ZrO_2$ based ceramic as a top coat as mentioned at the following step, the thickness of the $Al_2O_3$ layer is preferable to be 1-30 μm. When the thickness of the $Al_2O_3$ layer is less than 1 μm, the denseness is lacking and the excellent resistance to high-temperature environment can not be developed, while when it exceeds 30 μm, the long time is taken for the formation of the coating and the operation efficiency considerably lowers.

Figure 1B:
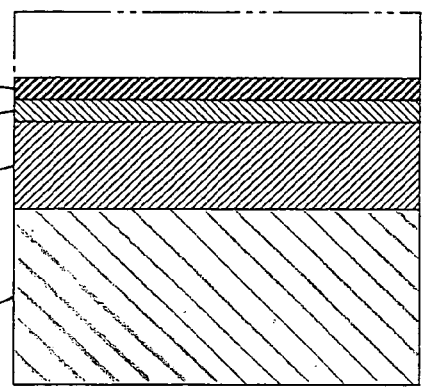

FIGS. 1a and 1b schematically show the course of forming the $Al_2O_3$ layer through the steps of the above items (1)-(4). For example, Al in a MCrAlX alloy coating (undercoat) 2 formed on a substrate 1 of Ni-based superalloy is preferentially reacted with $Cr_2O_3$ layer 3 formed on the undercoat by heating at 950-1500 K for 1-30 hours to selectively oxidize Al to thereby newly form $Al_2O_3$ layer 4 on the MCrAlX alloy coating 2. Also, Cr coating layer is retained on the $Al_2O_3$ layer 4 through reduction reaction of Al. This Cr coating layer is immediately oxidized by heating in air to again render into $Cr_2O_3$. Finally, the MCrAlX alloy coating 2 (undercoat), the $Al_2O_3$ layer 4 and the $Cr_2O_3$ layer 3 are formed on the surface of the substrate 1 in this order.

However, when the heating at 950-1500 K for 1-30 hours is carried out under vacuum or in an inert gas, the Cr coating reduced by Al remains on the $Al_2O_3$ layer as it is, so that the coating produced under such an environment is constructed with the $Al_2O_3$ layer and $Cr_2O_3$ layer or the $Cr_2O_3$ layer containing metallic Cr. Moreover, the metallic Cr coating is immediately oxidized into $Cr_2O_3$ under an environment of actual gas turbine, so that the same coating construction as mentioned above is finally attained according to the same behavior as mentioned above.

As previously mentioned, the $Cr_2O_3$ layer has a property of evaporating as $CrO_3$ at a higher temperature of not lower than 1300 K. In the invention, however, the $Al_2O_3$ layer having an excellent protection property is uniformly formed just beneath the $Cr_2O_3$ layer, so that even if the $Cr_2O_3$ layer is evaporated, the resistance to high-temperature oxidation of the MCrAlX alloy coating can be maintained.

As mentioned above, the method according to the invention utilizes the chemical reaction between Al contained in the MCrAlX alloy coating and the $Cr_2O_3$ layer formed on the surface thereof, so that the $Al_2O_3$ layer having an excellent protection property can be produced even if the atmosphere in the heating is not only air but also under vacuum, an inert gas such as Ar or the like, a combustion gas such as fossil fuel for an actual gas turbine or steam. That is, the invention has a feature that the freedom degree of the heating atmosphere condition is very high.

(C) Formation of Top Coat

In the invention, there are the following two methods as a step of forming the top coat.

(i) The undercoat of the heat-resistant alloy is formed on the surface of the substrate of the heat-resistant alloy and the $Cr_2O_3$ layer is formed on the surface thereof by the chemical method and then $ZrO_2$ based ceramic layer is formed on the surface of the $Cr_2O_3$ layer as a top coat.

(ii) The undercoat of the heat-resistant alloy is formed on the surface of the substrate of the heat-resistant alloy and the $Cr_2O_3$ layer is formed on the surface thereof by the chemically densifying method and heated at a high temperature of not lower than 1273 K. By this operation is formed the dense $Al_2O_3$ layer on the surface of the undercoat through the selective oxidation of only Al. The top coat of $ZrO_2$ based ceramic is formed thereon. Moreover, a part or whole of the $Cr_2O_3$ layer may be sublimated under a high-temperature environment of not lower than 1200 K, but the formation of the top coat is possible even at this state and also the effect thereof can be sufficiently expected.

Figure 2A:
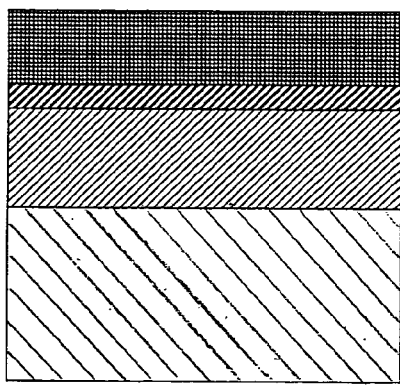
FIG. 2a and FIG. 2b are a diagrammatically section view illustrating the formation of a top coat made of $ZrO_2$ ceramic on a surface of an Al-containing alloy coating as a thermal barrier coating by the method of the invention.
Figure 2B:
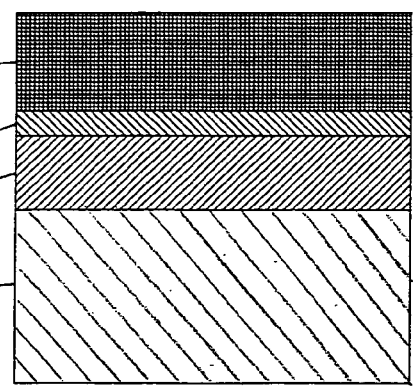

The sectional structure of TBC after the formation of the top coat is shown in FIGS. 2a and 2b. In this case, numeral 1 is a substrate, numeral 2 an undercoat, numeral 3 a $Cr_2O_3$ layer (middle layer), numeral 4 an $Al_2O_3$ layer, and numeral 5 a top coat. That is, in FIG. 2a, the top coat 5 of $ZrO_2$ based ceramic is directly formed on the $Cr_2O_3$ layer 3 formed on a surface of the undercoat 2. When strongly corrosive gasphase components such as SOx, HCL and the like are existent in the atmosphere used, even if these components penetrate into the inside through opening pore portions of the top coat, the corrosion of the undercoat is prevented owing to the presence of the $Cr_2O_3$ layer having an excellent corrosion resistance, so that the TBC of the above coating structure develops good TBC performances over a period of long time.

A maximum use temperature of the TBC having this structure is preferable to be less than 1350 K as a surface temperature of the undercoat. That is, $Cr_2O_3$ sublimates (vaporize) on the undercoat under an environment of not lower than 1350 K to finally take a structure as shown in FIG. 2b. However, the dense $Al_2O_3$ layer having an excellent corrosion resistance is uniformly formed on the surface of the undercoat in the TBC subjected to such a heat hysteresis, so that the surface of the undercoat is not corroded with the corrosive gases and the like and can maintain the good corrosion resistance.

As can be understood from the above, in the TBC according to the invention, the $Cr_2O_3$ layer formed on the undercoat develops an important action. In the formation of the top coat, however, it is necessary that the particles for the top coat burst through the $Cr_2O_3$ layer and arrive at the surface of the undercoat. For this purpose, if the thickness of the $Cr_2O_3$ layer is too thick, it is difficult to directly bond to the undercoat, so that the thickness is preferable to be a range of 0.2-10 μm. When the thickness is less than 0.2 μm, the action mechanism of the $Cr_2O_3$ layer is insufficient, while when it exceeds 10 μm, it is difficult to directly contact the particles for the top coat with the surface of the undercoat.

In the structure shown in FIG. 2b, the $Cr_2O_3$ layer formed on the surface of the undercoat is heated at a temperature of not lower than 1350 K to selectively oxidize Al component in the undercoat to thereby form the dense $Al_2O_3$ layer on the surface of the undercoat and thereafter the $ZrO_2$ based ceramic coating is directly formed thereon as a top coat.

Moreover, $ZrO_2$ based ceramic containing 5-40 mass % of one or more oxides selected from $Y_2O_3$, CaO, $CeO_2$, MgO, $SiO_2$, $Yb_2O_3$ and $Sc_2O_3$ is used as a material for the top coat. These materials are plasma-sprayed in air or under a reduced pressure to form a top coat having a thickness of 50-600 μm. Also, the formation of the top coat may be carried out by EB-PVD process.

When the thickness of the top coat is less than 50 μm, the function of protecting the undercoat from radiant heat or conductive heat is low, while when it exceeds 600 μm, it is not observed to considerably improve the action mechanism as a top coat and also it tends to weaken the bonding force between the mutual $ZrO_2$ based ceramic particles constituting the top coat, and hence such a thickness is inconvenient in view of economic reason and the performances of TBC.

EXAMPLE 1

In this example, test pieces Nos. 5-8 of Table 2 prepared in the aforementioned experiment are used to form top coats comprising 8 mass % of $Y_2O_3$ and balance being ZrO2 (hereinafter abbreviated as 8YZ) and having a thickness of 300 μm through a plasma spraying process in air, and then the thermal shock test is conducted under a condition that the heating at 1400 K for 15 minutes and the cooling of charging into water of 25° C. are repeated. The test results are shown in Table 4.

TABLE 4

| | State of test pieces before formation of top coat | | | | Test after formation of top coat | |
|---|---|---|---|---|---|---|
| | Al content in MCrAlX alloy coating | Presence or absence of formation of $Cr_2O_3$ layer | Presence or absence of heating treatment of 1350 K × 9 h | | Result of thermal shock test 1400 K × 15 min. ⇔ in water of | |
| No. | (mass %) | | in air | in Ar | 15° C. | Remarks |
| 1 | 3 | presence | absence | absence | ○ | A |
| 2 | | | presence | absence | ○ | A |
| 3 | | | absence | presence | ○ | A |
| 4 | | absence | absence | absence | ○ | B |
| 5 | | | presence | absence | ○ | B |
| 6 | | | absence | presence | ○ | B |
| 7 | 8 | presence | absence | absence | ○ | A |
| 8 | | | presence | absence | ○ | A |
| 9 | | | absence | presence | ○ | A |
| 10 | | absence | absence | absence | ○ | B |
| 11 | | | presence | absence | ○ | B |
| 12 | | | absence | presence | ○ | B |

(Note)
(1) Composition of MCrAlX alloy as shown in Table 1
(2) Formation of undercoat of 300 μm in thickness is conducted by plasma spraying process under a reduced pressure.
(3) Formation of $Cr_2O_3$ layer is conducted by repeating operation of immersing in 30% $CrO_3$ and heating at 750 K for 20 minutes 5 times.
(4) 8YZ coating as a top coat has a thickness of 300 μm.
(5) "A" in column "Remarks" is an acceptable example and "B" is a comparative example.
(6) Symbol "○" in column "thermal shock test" indicates no peeling of top coat.

As seen from the results of Table 4, not only Nos. 1 and 7 of directly forming the top coat on the middle layer of $Cr_2O_3$ layer according to the invention but also Nos. 2, 3, 8 and 9 of forming the top coat after the middle layer is formed and heated at 1350 K for 9 hours have the good resistance to thermal shock and do not observe local peeling of the top coat at all. That is, it has been confirmed that these products have the performances equal to those of the coatings Nos. 4-6 and 10-12 according to the existing technique.

EXAMPLE 2

The test pieces provided with the top coats in the same manner as in Example 1 are subjected to a high-temperature corrosion test to evaluate the corrosion resistance of TBC according to the invention.

Moreover, the corrosion test is carried out under conditions that the test piece is left to stand in a cylindrical electric furnace at a temperature of 773 k for 100 hours while flowing air containing 1000 ppm of each of $SO_2$ and HCl thereinto at a rate of 100 ml/1 minute. After the test, the presence or absence of the peeling of the top coat is examined by observing the appearance of the test piece. The results are shown in Table 5.

TABLE 5

| No. | Al content in MCrAlX alloy coating (mass %) | Presence or absence of formation of $Cr_2O_3$ layer | Presence or absence of heating treatment of 1350 K × 9 h in air | Presence or absence of heating treatment of 1350 K × 9 h in Ar | Test after formation of top coat Result of high-temperature corrosion test 773 K × 100 h $SO_2$ (1000 ppm) | Test after formation of top coat Result of high-temperature corrosion test 773 K × 100 h HCL (1000 ppm) | Remarks |
|---|---|---|---|---|---|---|---|
| 1 | 8 | presence | absence | absence | ○ | ○ | A |
| 2 | | | presence | absence | ○ | ○ | A |
| 3 | | | absence | presence | ○ | ○ | A |
| 4 | | absence | absence | absence | Δ | X | B |
| 5 | | | presence | absence | Δ | X | B |
| 6 | | | absence | presence | Δ | Δ | B |
| 7 | 12 | presence | absence | absence | ○ | ○ | A |
| 8 | | | presence | absence | ○ | ○ | A |
| 9 | | | absence | presence | ○ | ○ | A |
| 10 | | absence | absence | absence | Δ | X | B |
| 11 | | | presence | absence | Δ | X | B |
| 12 | | | absence | presence | Δ | Δ | B |

(Note)
(1) coating formation under the same condition as in the test piece of Example 1 (table 4)
(2) Symbol of results of high-temperature corrosion test
○: no peeling of top coat
Δ: local peeling
X: large peeled area The test pieces Nos. 1-3 and 7-9, in which the top coat is formed after the middle layer of $Cr_2O_3$ layer is formed on the surface of the NCrAlX alloy, do not utterly observe the peeling of the top coat not only in case of directly forming the top coat on the middle layer (Nos. 1, 7) but also in case of laminating the top coat after the heating at 1350 K for 9 hours (Nos. 2, 3, 8, 9). This is considered due to the fact that the corrosion action of the gas components such as $SO_2$, HCL and the like is prevented by the presence of the middle layer of $Cr_2O_3$ layer formed on the surface of the undercoat of MCrAlX alloy (Nos. 1, 7) or by the dense $Al_2O_3$ layer formed on the surface of the undercoat by the heating treatment.

On the other hand, the test pieces Nos. 4-6 and 10-12, in which the top coat is formed without forming the middle layer of $Cr_2O_3$ layer, are corroded under the action of $SO_2$, HCl gas to lower the bonding force to the top coat and hence easily peeled off because the formation of composite oxide containing Co, Ni, Cr and Al (Nos. 4, 5, 10, 11) and the formation of dense $Al_2O_3$ layer (Nos. 6, 12) are not conducted even when the heat treatment is carried out under the same conditions.

EXAMPLE 3

In this example, TBC test piece is formed by using MCrAlX alloy containing 8 mass % of Al as an undercoat, forming the middle layer of $Cr_2O_3$ layer on the undercoat by the method of Example 1, and forming the top coat of $ZrO_2$ based ceramic having longitudinal cracks by the method described on JP-A-2000-301655, i.e. plasma spraying process and electron bean deposition process, and then subjected to a corrosion test under the same conditions as in Example 2. The thickness of the undercoat is 100 μm, and the thickness of the middle layer is 3 μm, and the thickness of 8 mass % $Y_2O_3$—$ZrO_2$ based ceramic as the top coat is 250 μm. Moreover, the two-layer structure coating having no middle layer is subjected to the corrosion test as a comparative example.

With respect to the test pieces, wherein the formation of the top coat is conducted by the plasma spraying process described in JP-A-2000-301655, the results of the corrosion test are shown in Table 6. With respect to the test pieces wherein the fine particles of $ZrO_2$ based ceramic are grown in a columnar form by the electron beam deposition process a top coat, the results of the corrosion test are shown in Table 7.

TABLE 6

| No. | Al content in MCrAlX alloy coating (mass %) | Presence or absence of formation of $Cr_2O_3$ layer | Presence or absence of heating treatment of 1350 K × 9 h in air | Presence or absence of heating treatment of 1350 K × 9 h in Ar | Test after formation of top coat Result of high-temperature corrosion test $SO_2$ (1000 ppm) | Test after formation of top coat Result of high-temperature corrosion test HCL (1000 ppm) | Remarks |
|---|---|---|---|---|---|---|---|
| 1 | 8 | presence | absence | absence | ○ | ○ | A |
| 2 | | | presence | absence | ○ | ○ | A |

TABLE 6-continued

| | State of test pieces before formation of top coat | | | | Test after formation of top coat Result of high-temperature corrosion test | | |
|---|---|---|---|---|---|---|---|
| | Al content in MCrAlX alloy coating | Presence or absence of formation of $Cr_2O_3$ | Presence or absence of heating treatment | | $SO_2$ | HCL | |
| No. | (mass %) | layer | of 1350 K × 9 h in air | in Ar | (1000 ppm) | (1000 ppm) | Remarks |
| 3 | | | absence | presence | ○ | ○ | A |
| 4 | | absence | absence | absence | X | X | B |
| 5 | | | presence | absence | X | X | B |
| 6 | | | absence | presence | X | X | B |

(Note)
(1) The top coat is 8 mass % $ZrO_2$ having longitudinal cracks formed by the method of JP-A-2000-301655 and has a thickness of 250 μm.
(2) Symbol of the results of high-temperature corrosion test
○: no peeling of top coat
X: large peeling of top coat
(3) "A" in remarks is an acceptable example, and "B" is a comparative Example.

TABLE 7

| | State of test pieces before formation of top coat | | | | Test after formation of top coat Result of high-temperature corrosion test | | |
|---|---|---|---|---|---|---|---|
| | Al content in MCrAlX alloy coating | Presence or absence of formation of $Cr_2O_3$ | Presence or absence of heating treatment | | $SO_2$ | HCL | |
| No. | (mass %) | layer | of 1350 K × 9 h in air | in Ar | (1000 ppm) | (1000 ppm) | Remarks |
| 1 | 8 | presence | absence | absence | ○ | ○ | A |
| 2 | | | presence | absence | ○ | ○ | A |
| 3 | | | absence | presence | ○ | ○ | A |
| 4 | | absence | absence | absence | X | X | B |
| 5 | | | presence | absence | X | X | B |
| 6 | | | absence | presence | X | X | B |

(Note)
(1) The top coat is a columnar crystal structure formed by the electron beam deposition process (8 mass % $Y_2O_3$—$ZrO_2$) and has a thickness of 250 μm.
(2) Symbol of the results of high-temperature corrosion test
○: no peeling of top coat
X: large peeling of top coat
(3) "A" in remarks is an acceptable example, and "B" is a comparative Example.

As seen from these results, when the top coat is provided with the longitudinal cracks or has the columnar crystal structure, the corrosive gas such as $SO_2$, HCl easily penetrates into the inside of the top coat and corrodes the surface of the undercoat and hence the bonding force to the top coat becomes weak and the top coat is easily peeled off (Nos. 4-6 in Table 6 and Nos. 4-6 on Table 7).

On the contrary, when the middle layer of $Cr_2O_3$ layer is formed on the undercoat as in the invention, the test pieces do not utterly observe abnormal state and maintain a sound state even if the longitudinal cracks or columnar crystals are existent in the top coat. From these results, it has been confirmed that the $Cr_2O_3$ layer formed on the surface of the undercoat develops the good corrosion resistance even the form of the top coat is longitudinal cracks or the columnar crystal.

As mentioned above, the thermal barrier coating developing excellent corrosion resistance and heat resistance under a high-temperature environment containing corrosive gases can be formed by forming an Al-containing heat-resistant alloy coating on the surface of a high-temperature exposing member used in a gas turbine, a jet engine or the like or a high-temperature member for a combustion furnace or various heat treating furnaces, forming a middle layer of $Cr_2O_3$ layer on the surface thereof by a chemical treatment, and directly forming a top coat of $ZrO_2$ based ceramic thereon.

Also, the thermal barrier coating being durable to corrosive gas and having a high bonding force to top coat can be formed by subjecting the chemically formed $Cr_2O_3$ layer to a heat treatment at a high-temperature environment of not lower than 1272 K to form the $Al_2O_3$ layer on the surface of the Al-containing heat-resistant alloy coating and then directly forming the top coat of $ZrO_2$ based ceramic thereon.

According to the invention, it is possible to form the thermal barrier coating having the corrosion resistance and heat resistance and hence it is possible to improve the high-temperature resistance of various high-temperature exposing members and prolong the service life thereof.

What is claimed is:

1. A coating material for a thermal barrier coating having excellent corrosion resistance and heat resistance comprising a substrate, an undercoat made of an aluminum-containing heat-resistant alloy, $Al_2O_3$ layer produced on the surface of the undercoat by preferentially oxidizing Al in the components of the undercoat in the presence of $Cr_2O_3$ layer and $Cr_2O_3$ layer formed thereon as a middle layer on the undercoat, and a top coat made of $ZrO_2$ based ceramic.

2. A coating material for a thermal barrier coating according to claim 1, wherein the $Cr_2O_3$ layer as a middle layer is a chemical densified film having a thickness of 0.2-10 μm.

3. A coating material for a thermal barrier coating according to claim 1, wherein the $Al_2O_3$ layer has a thickness of 1-30 μm.

4. A coating material for a thermal barrier coating according to claim 1, wherein the undercoat is a heat-resistant alloy having an Al content of 3-24 mass % and represented by the following chemical formula:

MCrAlX wherein
  M: one or more selected from Co, Ni and Fe,
  X: one or more selected from Y, Hf, Ta, Cs, Ce, La, Th, W, Si, Pt, Mn and B.

5. A coating material for a thermal barrier coating according to claim 1, wherein the undercoat is one formed by a spraying process or an electron beam deposition process at a thickness of 30-500 μm.

6. A coating material for a thermal barrier coating according to claim 1, wherein the top coat is a $ZrO_2$ based ceramic coating containing 5-40 mass % of at least one oxide selected from $Y_2O_3$, CaO, $CeO_2$, MgO, $SiO_2$, $Yb_2O_3$ and $Sc_2O_3$ and formed by a spraying process or an electron beam deposition process at a thickness of 50-600 μm.

7. A coating material for a thermal barrier coating according to claim 1, wherein the $Cr_2O_3$ layer as a middle layer is a chemical densified film having a thickness of 0.2-10 μm obtained by applying an aqueous solution of one or more selected from chromic anhydride, ammonium chromate and ammonium bichromate and firing it.

8. A coating material for a thermal barrier coating according to claim 1, wherein the undercoat is a heat-resistant alloy having an Al content of 3-24 mass % and represented by the following chemical formula:

MCrAlX wherein
  M: one or more selected from Co, Ni and Fe,
  X: one or more selected from Y, Hf, Ta, Cs, Ce, La, Th, W, Si, Pt, Mn and B.

9. A coating material for a thermal barrier coating according to claim 1, wherein the undercoat is one formed by a spraying process or an electron beam deposition process at a thickness of 30-500 μm.

10. A coating material for a thermal barrier coating according to claim 1, wherein the top coat is a $ZrO_2$ based ceramic coating containing 5-40 mass % of at least one oxide selected from $Y_2O_3$, CaO, $CeO_2$, MgO, $SiO_2$, $Yb_2O_3$ and $Sc_2O_3$ and formed by a spraying process or an electron beam deposition process at a thickness of 50-600 μm.

11. A method of producing a coating material for thermal barrier coating having excellent corrosion resistance and heat resistance, which comprises forming an undercoat made of a heat-resistant alloy having an Al content of 3-24 mass % on a surface of a substrate through spraying process or an electron beam deposition process, forming a middle layer of $Cr_2O_3$ layer having a thickness of 0.2-10 μm by repeating a procedure of applying an aqueous mixed solution of one or more of chromic anhydride, ammonium chromate and ammonium bichromate and firing under heating at 500-900 K for 1-5 hours one time or plural times, heating in an atmosphere or under vacuum or in an inert gas atmosphere at 1200-1500 K for 1-20 hours to form an $Al_2O_3$ layer produced through preferential oxidation reaction of Al contained in the undercoat on the surface of the undercoat just beneath $Cr_2O_3$ layer as a part of the middle layer, and forming a top coat of $ZrO_2$ based ceramic on the middle layer.

* * * * *

UNITED STATES PATENT AND TRADEMARK OFFICE
CERTIFICATE OF CORRECTION

PATENT NO.        : 7,445,434 B2
APPLICATION NO.   : 10/795998
DATED             : November 4, 2008
INVENTOR(S)       : Y. Harada et al.

It is certified that error appears in the above-identified patent and that said Letters Patent is hereby corrected as shown below:

On the cover page (75) Inventors, of the printed patent, "Yakema" should be --Takema--.

In the claims, column 17, line 36 (claim 6, line 4), of the printed patent, "$Y_2 O_3$" should be --$Y_2O_3$--.

Signed and Sealed this

Second Day of June, 2009

JOHN DOLL
*Acting Director of the United States Patent and Trademark Office*